United States Patent [19]

Alferness et al.

[11] 4,439,265

[45] Mar. 27, 1984

[54] FABRICATION METHOD FOR LINBO$_3$ AND LITAO$_3$ INTEGRATED OPTICS DEVICES

[75] Inventors: Rodney C. Alferness, Holmdel; Lawrence L. Buhl, New Monmouth; Janet L. Jackel, Holmdel; Susan P. Lyman, Matawan; Vellayan Ramaswamy, Lincroft, all of N.J.

[73] Assignee: Bell Telephone Laboratories, Incorporated, Murray Hill, N.J.

[21] Appl. No.: 284,472

[22] Filed: Jul. 17, 1981

[51] Int. Cl.$^3$ .............................................. C30B 31/06
[52] U.S. Cl. ............................ 156/606; 156/DIG. 89; 350/96.12
[58] Field of Search ............................ 252/501.1, 506; 156/DIG. 71, DIG. 87, DIG. 89, 606; 148/1.5, 189; 350/96.12

[56] References Cited

U.S. PATENT DOCUMENTS 4,082,601  4/1978  Regreny et al. ............ 156/DIG. 71

FOREIGN PATENT DOCUMENTS

| 50-154200 | 12/1975 | Japan . | |
| 52-53800 | 4/1977 | Japan | 156/DIG. 71 |
| 53-65299 | 6/1978 | Japan | 156/DIG. 71 |
| 54-9174 | 1/1979 | Japan | 156/DIG. 71 |
| 54-9171 | 1/1979 | Japan | 156/DIG. 71 |
| 54-9173 | 1/1979 | Japan | 156/DIG. 71 |
| 54-97584 | 8/1979 | Japan | 156/DIG. 71 |
| 54-97585 | 8/1979 | Japan | 156/DIG. 71 |
| 54-34159 | 10/1979 | Japan | 156/DIG. 71 |
| 55-42238 | 3/1980 | Japan . | |
| 56-120600 | 9/1981 | Japan . | |

OTHER PUBLICATIONS

Miller, "Integrated Optics", The Bell System Technical Journal, Sep. 1969, vol. 48, pp. 2059-2069.
Smith et al., "Correlation of Reduction", published in J. Appl. Phys., vol. 39, Sep. 1968, pp. 4600-4602.
Levinstein et al., "Reduction of the Susceptibility", Published in J. of Appl. Phys., vol. 38, Jul. 1967, pp. 3101-3102.
Burns et al., "Application of LiO$_2$", Published in Appl. Phys. Letts., vol. 33, Jul. 1978, pp. 70-72.
Schmidt et al., "Metal-Diffused Optical Waveguides", Published in Applied Physics Letts., vol. 25, Oct. 1974, pp. 458-460.
Chemical Abstracts, vol. 89, 1978, Abstract 68,896, p. 602.
Holman et al., "Chemical Control of Optical Damage", Published in Appl. Phys. Lett., vol. 32, Mar. 1978, pp. 280-283.
Carruthers et al., "Diffusion Kinetics", Published in Appl. Optics, vol. 13, Oct. 1974, pp. 2333-2342.
Kaminow et al., "Optical Waveguiding", Published in Appl. Phys. Lett., vol. 22, Apr. 1973, pp. 326-328.
Ranganath et al, "Suppression of Li$_2$O", Published in Appl. Phys. Lett., vol. 30, Apr. 1977, pp. 376-379.
Mason, "Crystal Physics of Interaction Processes", Academic Press, New York, 1966, pp. 110-111.
Noda et al., "Effect of Mg diffusion", Published in J. of Appl. Phys., vol. 49, Jun. 1978, pp. 3150-3154.
Esdaile, "Closed Tube Control", Published in Appl. Phys. Lett. 33, Oct. 1978, pp. 733-734.
Chen et al., "Elimination of Li$_2$O", Published in Appl. Phys. Lett., vol. 30, Jun. 1977, pp. 570-571.
Miyazawa et al., "A Simple Technique", Published in Appl. Phys. Letts., vol. 31, Dec. 1977, pp. 742-744.

*Primary Examiner*—Hiram H. Bernstein
*Attorney, Agent, or Firm*—Richard D. Laumann; Eugen E. Pacher

[57] ABSTRACT

A simple, inexpensive, and reliable technique for substantially preventing the unwanted formation of a surface guiding layer during manufacture of light-guiding structures in LiNbO$_3$ and LiTaO$_3$ substrates is disclosed. The technique involves addition of an effective amount of a gaseous hydrogen donor to the processing atmosphere during high-temperature processing. A particularly convenient hydrogen donor is water vapor, which can be added to the atmosphere by, for instance, bubbling of the feed gas through a water column. A partial pressure of more than about 9 Torr of H$_2$O has been found effective in the practice of the technique.

4 Claims, 1 Drawing Figure

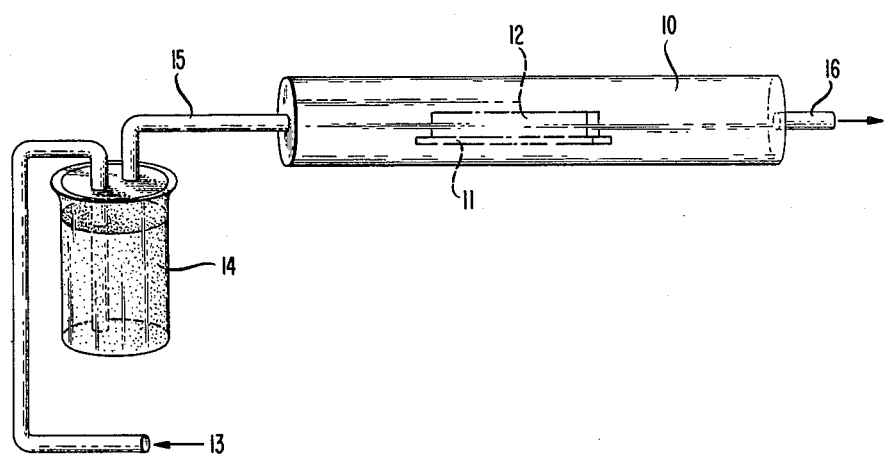

FABRICATION METHOD FOR LiNBO₃ AND LiTaO₃ INTEGRATED OPTICS DEVICES

BACKGROUND OF THE INVENTION

1. Technical Field

This invention relates to integrated optics devices, more particularly, it relates to an improved method for producing light-guiding structures in lithium niobate (LiNbO$_3$) and lithium tantalate (LiTaO$_3$) substrates.

2. Background and Prior Art

The operation of intergrated optics devices relies, inter alia, on the fact that electromagnetic radiation, e.g., optical or infrared radiation, can propagate through, and be contained by, layers of transparent materials. By forming such layers in appropriate substrates and shaping them into appropriate configurations, integrated optics technology has realized a variety of components which can perform a wide range of operations on optical radiation, e.g., guiding, modulating, deflecting, and filtering. See, for instance, S. E. Miller, "Integrated Optics: An Introduction," *The Bell System Technical Journal*, Vol. 48(7) pp. 2059–2069 (1969) and T. Tamir, *Integrated Optics*, Springer Verlag, New York, Heidelberg, Berlin (1975).

Materials that advantageously can serve as the basis for integrated optics devices include LiNbO$_3$ and LiTaO$_3$. These materials crystallize in the so-called trigonal crystal system which has a unique threefold symmetry axis, conventionally labeled the Z-axis or direction. The basal plane, i.e., the plane normal to the Z-direction, contains the unique X and Y directions, arranged at right angle to each other.

In general, optical radiation entering a crystal divides into two rays, called the ordinary ray and the extraordinary ray. These rays have polarization vectors at right angles to each other, and in general, they have different phase velocities, implying the existence of two refractive indices in such crystals, which are termed the ordinary refractive index $n_o$ and the extraordinary index $n_e$.

A typical waveguide used in integrated optics is a strip waveguide, typically a thin and narrow region having somewhat higher refractive indices than the surrounding medium, with typical transverse dimensions of one to several wavelengths of the radiation. This last requirement translates into typical transverse dimensions of integrated optics strip waveguides of one to several micrometers. Such guiding structures are generally defined and produced by lithographic techniques akin to those used in integrated circuit technology.

Several methods exist for changing the refractive indices of LiNbO$_3$ and LiTaO$_3$, but since the one of interest to us in this application is in-diffusion of appropriate metal ions we will restrict our discussion to this method. A wide variety of elements, including Cu, Ni, Ag, Fe and Ge may be diffused into LiNbO$_3$ or LiTaO$_3$ to form guiding layers, and R. V. Schmidt and I. P. Kaminow, *Applied Physics Letters*, Volume 25(8), pp. 458–460 (1974), showed that one promising class of metals includes the transition elements, exemplified by Ti, V, and Ni. A thin layer, typically several hundred Angstroms thick, of an appropriate metal is deposited onto the substrate surface bounding the region to be transformed into a waveguide. Heating the sample, typically in flowing argon or other inert atmosphere or in oxygen, to temperatures above about 800° C., typically (for Ti) in the neighborhood of 1000° C., for a time of the order of one to several hours, brings about the diffusion of the deposited metal into the substrate, resulting in a diffusant profile that depends on such factors as diffusion temperature, diffusion time, nature and crystal orientation of the matrix, and nature and thickness of the diffusant layer. After completion of the diffusion step the samples are typically allowed to cool to room temperature in an atmosphere of flowing oxygen.

In-diffusion of appropriate metal ions into LiNbO$_3$ and LiTaO$_3$ results typically in an increase in both $n_o$ and $n_e$, with the change in the refractive indices being typically proportional to the concentration of the in-diffused metal species. Thus, since in-diffusion of, e.g., Ti into LiNbO$_3$ and LiTaO$_3$ results in increases in both $n_o$ and $n_e$, both the ordinary and the extraordinary ray can be guided in Ti-diffused strip wave guides by the usual mechanism of total internal reflection.

It has been known for some time that maintaining LiNbO$_3$ or LiTaO$_3$ at elevated temperatures, of the order of 1000 degress C., can result in out-diffusion of Li$_2$O. See, for instance, J. R. Carruthers et al, *Applied Optics*, Volume 13(10), pp. 2333–2342 (1974). It is reported there that such out-diffusion does not affect $n_o$, but does increase the extraordinary index $n_e$ approximately linearly with decreasing concentration of Li$_2$O. Hence, such out-diffusion results in the creation of a surface layer having a higher $n_e$ than the unaltered substrate material. This surface region forms a guiding layer for the extraordinary ray, which is, in the geometries typically encountered in integrated optics, the ray that is polarized in the Z-direction. Such unwanted surface guides are typically formed during the process of in-diffusion of metal ions to form strip wave guides, and can adversely affect the operation of strip waveguides. In particular, since the strongest electro-optic coefficient for LiNbO$_3$, r$_{33}$, affects light of the extraordinary polarization, out-diffusion can become a significant problem in the fabrication of efficient optical waveguide devices.

The mechanism by which the above-described surface guiding layer can affect the operation of strip waveguides and related devices is the following. By raising the extraordinary index of refraction of the surface region of the substrate, and in particular in the substrate region adjacent to the nominal waveguide, the difference in $n_e$ between the strip guide and the surrounding substrate material is diminished, vanishes, or may even change sign, depending on the details of the situation. In any case, however, the ability of the strip waveguide to guide radiation polarized in the Z-direction will be diminished, resulting in leakage of radiation from the nominal waveguide to the surface guiding region. Such leakage not only constitutes a loss mechanism, but it also can lead to crosstalk between adjacent guides, and typically decreases the usefulness of Ti (and other metals) in-diffused strip waveguides for device applications. Thus, methods for avoiding or reversing such out-diffusion are of great interest, and a number of such methods have been found and applied.

One group of methods proposes to eliminate the depleted surface layer by means of in-diffusion of Li$_2$O. P. R. Ranganath and S. Wang, *Applied Physics Letters*, Volume 30(8), pp. 376–379, (1977) teach that, by carrying out the metal ion in-diffusion process in a gas stream, with chunks of Li$_2$O maintained upstream from the sample, the out-diffusion from the surface region can be avoided. This is thus a dynamical method, the success of which depends on maintaining at the sample surface some temperature-dependent minimum partial pressure of Li$_2$O during diffusion. In addition to requiring control of the vapor pressure, the method requires additional handling steps, and introduction of additional materials into the hot zone, with the attendant possibility of contamination of samples or equipment. S. Miyazawa, et al, *Applied Physics Letters*, Volume 31(11) pp. 742–744 (1977), teach that Li$_2$O out-diffusion can be suppressed by annealing the samples in Li$_2$CO$_3$ powder at 600 degrees C. prior to the metal in-diffusion process. This method has the obvious disadvantage of requiring an additional processing step, and furthermore typically causes surface damage to the samples due to direct contact of the surface with the Li$_2$CO$_3$ powder. B-U Chen and A. C. Pastor, *Applied Physics Letters*, Volume 30(11), pp. 570–571 (1977), annealed their LiNbO$_3$ samples subsequent to the in-diffusion of Ti in LiNbO$_3$ powder at 900 degrees C. for one hour or longer. This presumably led to a re-introduction of Li$_2$O into the depleted surface region, but the method is subject to the same shortcomings as that due to Miyazawa et al, supra.

Another approach to the control of out-diffusion is the carrying out of the in-diffusion step in a closed system. See R. J. Esdaile, *Applied Physics Letters*, Volume 33(8) pp. 733–734 (1978). This method relies on the establishment of equilibrium conditions early during the heat treatment, thereby minimizing loss of Li$_2$O from the sample. This is done in a manner that avoids some of the problems inherent in the analogous dynamical method due to Ranganath and Wang, op. cit., but does so at the cost of more involved apparatus and handling. J. Noda et al, *Journal of Applied Physics*, Volume 49(6), pp. 3150–3154, (1979) teach that by in-diffusing Mg into the depleted regions adjacent to the strip waveguide, the deleterious effects of Li$_2$O out-diffusion can be avoided, since the presence of Mg lowers $n_e$ in LiNbO$_3$. This method, although effective, involves several additional and relatively complex processing steps and introduces new materials into the process.

In summary then, several methods exist for avoiding the deleterious effects of Li$_2$O out-diffusion from the surface region of LiNbO$_3$ and LiTaO$_3$ samples into which Ti or other elements have been diffused, but none of these methods appear to be wholly satisfactory. A simple, inexpensive, and reliable method for dealing with this out-diffusion problem would thus be of considerable technological interest, since it would make possible the manufacture of improved and more efficient waveguiding structures and other integrated optic devices in LiNbO$_3$ and LiTaO$_3$.

SUMMARY OF THE INVENTION

The unwanted formation of a surface guiding layer during manufacture of light-guiding structures in LiNbO$_3$ and LiTaO$_3$ substrates can be prevented by a simple, inexpensive, and reliable method. The method involves addition of an effective concentration of a gaseous hydrogen donor to the atmosphere in contact with the substrate during high-temperature processing, thereby greatly reducing out-diffusion of Li$_2$O from the substrate. A particularly convenient hydrogen donor is water vapor, which can be added to the atmosphere by, for instance, bubbling of feed gas through a water column, but the use of other hydrogen donors is possible.

BRIEF DESCRIPTION OF THE DRAWING

The FIGURE schematically shows apparatus for practicing the invention by means of addition of water vapor to the processing atmosphere.

DETAILED DESCRIPTION

Since formation of the unwanted surface guide for z-polarized light in LiNbO$_3$ and LiTaO$_3$ samples during high-temperature processing is typically due to out-diffusion of lithium, typically in the form of Li$_2$O, prevention of this out-diffusion during device manufacture can result in devices free of unwanted guiding regions. We have found that carrying out at least part of the high-temperature processing while the article being processed is in contact with an atmosphere containing an effective concentration of a hydrogen donor prevents or substantially reduces formation of such a surface guiding region. Hydrogen gas, as well as any compound that is gaseous at the processing temperature, i.e., temperatures greater than approximately 700° C., is capable of supplying atomic hydrogen to the sample when in contact therewith at that temperature, and which does not cause any substantial deleterious change in the sample, can in principle be used as hydrogen donor in the inventive process. The preferred hydrogen donor is water vapor because it is effective, cheap, safe, and can be administered with no more than minimal apparative effort.

The concentration of hydrogen donor in the processing atmosphere affects the result of the treatment. Although the actual amount required depends on the identity of the donor, the details of the chemistry of the sample material (e.g., the amount of hydrogen present in the material prior to the relevant high-temperature processing step), and the processing temperature, the desired processing conditions can be ascertained from the following considerations. The minimum concentration of donor required for successful practice of the instant invention for any particular set of conditions, referred to as "minimum effective concentration", is that concentration that results in the incorporation into the sample of hydrogen in an amount sufficient to prevent substantial loss of lithium from the surface region of the sample. For example, since a Li deficiency of 0.1% results in approximately a 0.2% increase in $n_e$, which in turn causes measurable deterioration of the guiding properties of strip-diffused lightguides in LiNbO$_3$ and LiTaO$_3$, we consider 0.05% surface loss to be the upper limit of acceptable Li loss in the substrate adjacent to such lightguides. And furthermore, a lower limit of the hydrogen donor partial pressure in the processing atmosphere necessary for the practice of our invention is typically about 5 Torr. Processing according to the invention typically substantially reduces, and may completely prevent, formation of surface guiding layers in LiNbO$_3$ and LiTaO$_3$ substrates of all orientations and for all propagation directions in which birefringence exists in the unaltered substrate. This is by the example below.

An advantageous way of practicing our invention is schematically depicted in the FIGURE. In a tube furnace and inside quartz tube 10, a LiNbO$_3$ or LiTaO$_3$ sample 12 on support 11 is exposed to the processing atmosphere. A metered flow of feed gas, e.g., argon or oxygen, enters through feed line 13 bubbler 14 where it flows through a water column of adjustable height and temperature, and then enters 10 through inlet line 15, leaving the system again through vent 16.

In the bubbler, water vapor is added to the feed gas, the vapor concentration being adjustable through, inter alia, control of temperature or height of the water column. For instance, at room temperature ($\sim 20°$ C.) a 5 cm high column resulted in one embodiment in approximately 50% relative humidity of a 1.5 l/min flow of feed gas (corresponding to a partial pressure of $H_2O$ of about 9 Torr, or a transport rate of approximately 13 mgm/min of $H_2O$), whereas a 15 cm high column gave $\sim 80\%$ relative humidity under the same conditions ($\sim 14$ Torr, $\sim 21$ mgm/min).

EXAMPLE 1 mm thick samples of acoustic grade $LiNbO_3$ (x-, y-, and z-cuts) were heated in flowing feed gas (flow rate about 1.5 l/min) at a rate of $\sim 3.5°$ C./min, from room temperature to $\sim 980°$ C., and maintained at that temperature for about 4 hours, after which the temperature was allowed to drop at a rate of about $10°$ C./min. During cooling, the feed gas was $O_2$, during the other parts of the heat treatment it was Ar. All the feed gas was passed through a bubbler containing water at room temperature.

(a) Water column $\sim 15$ cm high: inspection with light from a HeNe laser showed that no surface guide was produced. OH-absorption measurements before the high-temperature treatment showed the presence of a measurable amount of OH in the sample, yielding, for instance, in a z-cut sample an optical density (OD) of $\sim 0.92$ cm$^{-1}$ at 3480 cm$^{-1}$, where OD$\equiv \log_{10} I_{in}/I_{out}$, for a sample 1 cm thick, with I being the intensity of the probe beam. Similar measurements after the treatment showed an increase in absorption, to an OD of 1.7 cm$^{-1}$.

(b) Water column $\sim 5$ cm high: the treatment referred to in (a) did not prevent formation of a surface guide for the extraordinary polarization. A decrease by approximately 60% in the OH-absorption was measured.

What is claimed is:

1. Method for manufacturing an optical device comprising an in-diffused strip lightguiding region in a substrate comprising material selected from the group consisting of $LiNbO_3$ and $LiTaO_3$, the method comprising
   diffusing metal atoms into the substrate during a high-temperature diffusion step comprising heating the substrate to a temperature greater than about 700° C.,
   characterized in that the method further comprises
   contacting at least part of the substrate with an atmosphere comprising at least a minimum effective concentration of a hydrogen donor, the contact occurring during at least part of the time the substrate is, during the diffusion step, at the temperature greater than about 700° C., thereby preventing a substantial decrease of the Li concentrations in the contacted surface region of the substrate.

2. Method of claim 1, wherein the hydrogen donor is water vapor.

3. Method of claim 2, wherein the water vapor is added to the atmosphere by flowing a feed gas through a bubbler containing liquid water.

4. Method of claim 2, wherein the atmosphere comprises water vapor having a partial pressure of at least 9 Torr.

* * * * *